(12) United States Patent
Hiraga

(10) Patent No.: US 9,400,300 B2
(45) Date of Patent: Jul. 26, 2016

(54) ELECTRIC CIRCUIT EVALUATION METHOD

(71) Applicant: ROHM CO., LTD., Kyoto (JP)

(72) Inventor: Noriaki Hiraga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 236 days.

(21) Appl. No.: 14/296,554

(22) Filed: Jun. 5, 2014

(65) Prior Publication Data

US 2014/0368212 A1  Dec. 18, 2014

(30) Foreign Application Priority Data

Jun. 13, 2013 (JP) .................................. 2013-124404

(51) Int. Cl.
  *G01R 31/02* (2006.01)
  *G01R 23/02* (2006.01)
  *G01R 31/00* (2006.01)
  G01R 19/00 (2006.01)
  G01R 31/28 (2006.01)

(52) U.S. Cl.
  CPC ............ G01R 31/002 (2013.01); G01R 31/024 (2013.01); *G01R 19/0084* (2013.01); *G01R 19/0092* (2013.01); *G01R 23/02* (2013.01); *G01R 31/021* (2013.01); *G01R 31/2805* (2013.01); *G01R 31/2812* (2013.01)

(58) Field of Classification Search
  CPC ............... G01R 31/002; G01R 31/024; G01R 31/2805; G01R 31/2812; G01R 23/00; G01R 23/02; G01R 27/02; G01R 21/133; G01R 19/0084; G01R 19/0092; G01R 19/2513

USPC ........... 324/500, 537, 522, 713, 76.11, 76.39; 702/1, 57, 64
See application file for complete search history.

(56) References Cited

U.S. PATENT DOCUMENTS 5,793,864 A * 8/1998 Ramsden ............... H04M 3/323
                                                    379/24
6,340,891 B1 * 1/2002 Yagi ..................... G01R 31/021
                                                    324/544

FOREIGN PATENT DOCUMENTS

JP         2007-278781 A    10/2007

* cited by examiner

*Primary Examiner* — Hoai-An D Nguyen
(74) *Attorney, Agent, or Firm* — Cantor Colburn LLP

(57) ABSTRACT

The electric circuit evaluation method according to the present invention comprises: a step for finding a malfunction power frequency property, in which the magnitude of a critical noise signal at which a designated electric circuit causes a malfunction is represented by the power injected into the designated electric circuit; and a step for finding a malfunction current frequency property, in which the magnitude of the critical noise signal at which the designated electric circuit causes a malfunction is represented by a current (I_LSI) flowing to a predetermined portion of the designated electric circuit, and a malfunction voltage frequency property, in which the magnitude of the critical noise signal at which the designated electric circuit causes a malfunction is represented by a voltage (V_LSI) occurring between predetermined points of the designated electric circuit, both of which properties found from the malfunction power frequency property.

17 Claims, 8 Drawing Sheets

ELECTRIC CIRCUIT EVALUATION METHOD

CROSS-REFERENCE TO RELATION APPLICATIONS

This application is based on the following Japanese application, the entire contents of which are incorporated by reference in the specification of this application. (1) Japanese Patent Application No. 2013-124404 (filing date: Jun. 13, 2013)

BACKGROUND OF THE INVENTION

1. Field of the Invention

The present invention relates to an electrical circuit evaluation method.

2. Description of Related Art

A conventional DPI (direct RF power injection) test attempts to find a malfunction power frequency property, which is the magnitude of a critical noise signal at which a designated electric circuit causes a malfunction, represented by the power injected into the designated electric circuit.

An example of prior art relating to this is Japanese Laid-open Patent Application No. 2007-278781.

A malfunction power frequency property is information that is easy to acquire, but has been difficult to treat as information for improving events that occur in the actual designated electric circuit.

SUMMARY OF INVENTION

The present invention was devised in view of the above problem discovered by the inventors of the present application, it being an object of the invention to provide an electric circuit evaluation method that can accurately perceive the causes of malfunctions and contribute to rapid improvements in circuit design, as well as an electric circuit evaluated by this method.

To achieve the object described above, an electric circuit evaluation method according to the present invention comprises: a step for finding a malfunction power frequency property, in which the magnitude of a critical noise signal at which a designated electric circuit causes a malfunction is represented by the power injected into the designated electric circuit; and a step for finding a malfunction current frequency property, in which the magnitude of the critical noise signal at which the designated electric circuit causes a malfunction is represented by a current flowing to a predetermined portion of the designated electric circuit, and a malfunction voltage frequency property, in which the magnitude of the critical noise signal at which the designated electric circuit causes a malfunction is represented by a voltage occurring between predetermined points of the designated electric circuit, both properties being found from the malfunction power frequency property.

An electric circuit according to the present invention is provided together with data pertaining to a malfunction current frequency property, which is the magnitude of a critical noise signal at which the electric circuit causes a malfunction, represented by a current flowing to a predetermined portion of the electric circuit, and data pertaining to a malfunction voltage frequency property, which is the magnitude of a critical noise signal at which the electric circuit causes a malfunction, represented by a voltage occurring between predetermined points of the electric circuit.

Other characteristics, elements, steps, advantages, and properties of the present invention are further clarified by the detailed description of the preferred embodiments and the related accompanying drawings, continued below.

DETAILED DESCRIPTION OF PREFERRED EMBODIMENTS

<DPI Test>

Figure 1:
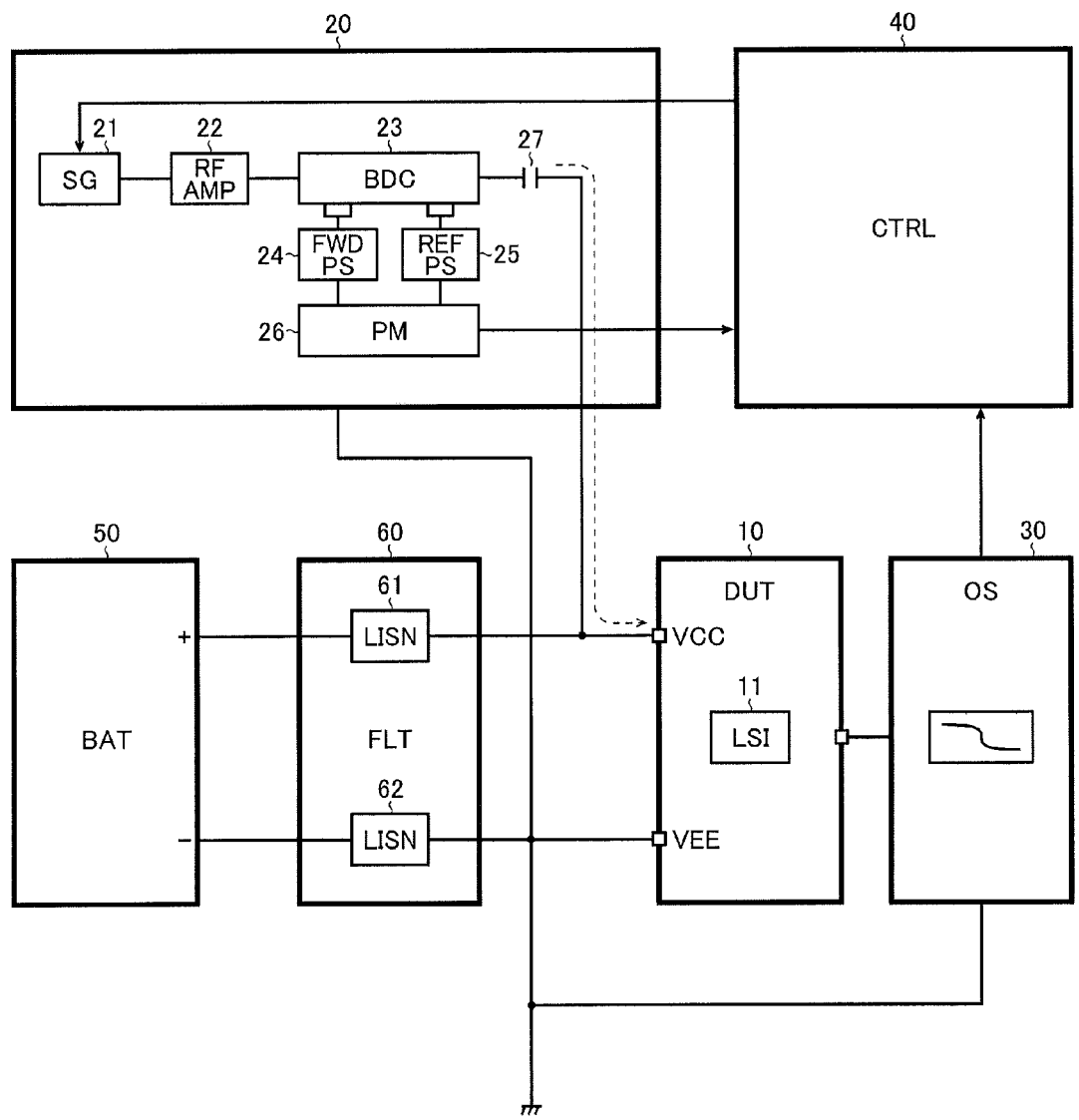
FIG. 1 is a block diagram showing a configuration example of a DPI test.

FIG. 1 is a block diagram showing a configuration example of a DPI test. A DPI test is one method (IEC62132-4) of verifying EMS (electromagnetic susceptibility) for a semiconductor integrated circuit, standardized by the International Electrotechnical Commission (IEC), and is carried out using a device under test 10 (referred to below as the DUT 10), as well as a noise source 20, a detection part 30, a controller 40, a battery 50, a power source filter 60, and the like.

The DUT 10 includes a designated electric circuit 11 (referred to below as the LSI 11), a printed circuit board (PCB) on which the LSI is installed. The LSI 11 alone can also of course be used as the DUT 10. The DUT 10 does not need to be a real device, and mock devices for testing are commonly used.

When a plurality of LSIs are compared to each other (for example, a new-model LSI and an old-model LSI are compared, or an LSI of one's own company and a compatible LSI of another company are compared), it is preferable to use a mock device for testing that has common configurative elements (the size and wiring pattern of the PCB, the type and properties of discreet components installed on the PCB, etc.) other than the LSIs being evaluated.

The noise source 20, which is a main element for injecting high-frequency noise signals (interference power) into the terminals (a power source terminal VCC is shown in FIG. 1) of the DUT 10, includes a signal generator 21, an RF amplifier 22, a bi-directional coupler 23, a forward wave power sensor 24, a reflected wave power sensor 25, a power meter 26, and a coupling capacitor 27.

The signal generator (SG) 21 generates a high-frequency noise signal in the form of a sine wave. The oscillation frequency and amplitude of the high-frequency noise signal can be controlled by the controller 40.

The RF (radio frequency) amplifier 22 amplifies the high-frequency noise signal generated by the signal generator 21 at a predetermined gain.

The bi-directional coupler (BDC) 23 separates the high-frequency noise signal amplified by the RF amplifier 22 into forward wave component that goes to the DUT 10 and a reflected wave component that returns from the DUT 10.

The forward wave power sensor 24 measures the power of the forward wave component separated by the bi-directional coupler 23. The reflected wave power sensor 25 measures the power of the reflected wave component separated by the bi-directional coupler 23. The transmission lines to the forward wave power sensor 24 and the reflected wave power sensor 25 are preferably kept in a pseudo-isolated state (for example, an impedance of 50Ω or more and a power transmission property of −20 dBm or less).

The power meter 26 sends to the controller 40 the forward wave power measured by the forward wave power sensor 24 and the reflected wave power measured by the reflected wave power sensor 25. The power actually injected into the DUT 10 is calculated by a difference computation by the controller 40, and the calculation result is recorded in the controller 40. Thus, the power injected into the DUT 10 is measured by the power meter 26, which is separate from the DUT 10. Therefore, to measure the power injected into the DUT 10 with high precision, the cable loss during high-frequency noise signal transmission is preferably reduced to as small of a value as possible (1 dB or less, for example).

The coupling capacitor 27, which is connected between the output terminal of the bi-directional coupler 23 and the DUT 10, cuts out the DC component to allow transmission of only the AC component (the high-frequency noise signal). In FIG. 1, the coupling capacitor 27 is portrayed as a configurative element of the noise source 20, but there are many cases in which a ceramic capacitor instead is placed on the PCB equipped with the LSI 11.

The detection part 30 observes the output waveform of the DUT 10 and sends the observation result to the controller 40. An oscilloscope or the like can be suitably used as the detection part 30. A differential probe of high-input impedance (1 MΩ) is preferably used to put the transmission line from the DUT 10 to the detection part 30 in a pseudo-isolated state so that the presence of the detection part 30 does not affect the DPI test.

The controller 40 is a main element for collectively controlling the DPI test. When the DPI test is carried out, the controller 40 keeps constant the oscillation frequency of the high-frequency noise signal injected into the DUT 10, for example, and controls the signal generator 21 so that the amplitude (injected power) of the high-frequency noise signal gradually increases. The controller 40 performs a LSI 11 malfunction determination (a determination of whether or not there has been a pulse omission or frequency disturbance in the clock signal, a deviation from the standard output voltage, a communication error, or the like) according to the observation result of the detection part 30, in parallel with the amplitude control described above. The controller 40 then acquires the result of computing the value measured by the power meter 26 (the power injected into the DUT 10) at the point in time when the LSI 11 malfunction occurred, and stores this result associated with the oscillation frequency of the current setting. By thereafter repeating this measurement while sweeping the oscillation frequency of the high-frequency noise signal, the controller 40 attempts to find the malfunction power frequency property, which is the association between the oscillation frequency of the high-frequency noise signal and the injected power at the time the malfunction occurred. A personal computer or the like that can sequentially carry out the above-described measurement can be suitably used as the controller 40.

The battery 50 is a DC power source for supplying power to the DUT 10. When the evaluation target of the DPI test is an onboard LSI, for example, an onboard battery may be used as the battery 50. The DC power source for the DUT 10 is not limited to a battery, and can also be an AC/DC converter or the like for generating the desired DC power from applied AC power.

The power source filter 60, which is a circuit part for putting the transmission line from the noise source 20 to the battery 50 into a pseudo-isolated state, includes power source impedance stabilization circuit networks 61 and 62 (referred to below as LISNs (line impedance stabilization networks) 61 and 62). The LISNs 61 and 62 both stabilize the apparent impedance of the battery 50. The LISN 61 is inserted into the power source line connecting a positive electrode terminal (+) of the battery 50 and a power source terminal (VCC) of the DUT 10, and the LISN 62 is inserted into a GND line connecting a negative electrode terminal (−) of the battery 50 and a GND terminal (VEE) of the DUT 10.

<DPI Test Result (Malfunction Power Frequency Property)>

Figure 2:
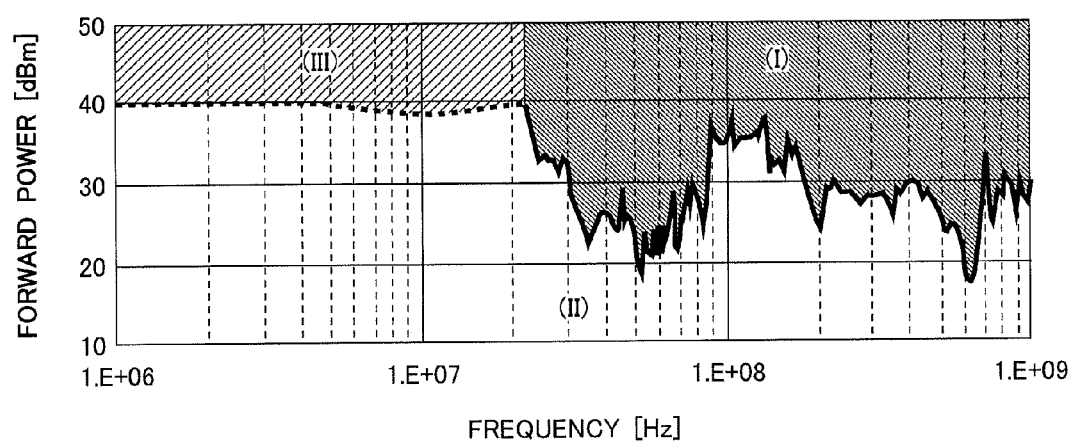
FIG. 2 is a graph showing an example of a DPI test result (malfunction power frequency property)

FIG. 2 is a graph showing an example of a DPI test result (malfunction power frequency property). The horizontal axis of the graph represents the oscillation frequency [Hz] of the high-frequency noise signal, and the vertical axis represents the injected power [dBm] of the high-frequency noise signal. This graph plots the critical injected power at which the LSI 11 causes a malfunction at each oscillation frequency of the high-frequency noise signal as the result of the DPI test (refer to the solid line in the graph). Specifically, the solid line in the graph the malfunction boundary, the area (I) above the solid line is therefore a malfunctioning area, and the area (II) below the solid line is a normally functioning area.

A predetermined maximum power (38 to 40 dBm, for example) is provisionally plotted at oscillation frequencies that do not cause a malfunction even when the aforementioned maximum power is injected (refer to the dashed line in the graph). Specifically, the dashed line in the drawing is the normal function ensuring boundary, the area (III) above the dashed line is therefore a non-ensuring area, and the area (II) below the dashed line is a normally functioning area.

Thus, the DPI test attempts to find the malfunction power frequency property, which is the magnitude of the critical high-frequency noise signal at which the DUT 10 causes a malfunction, represented by the power injected into the DUT 10. As stated in the background art paragraph, the malfunction power frequency property is information that is easily acquired, but has been difficult to treat as information for improving events that occur in the actual LSI 11.

In view of this, below is a proposal of an electric circuit evaluation method which, in addition to having a step for finding the above-described malfunction power frequency property through a DPI test, also has a step for finding a malfunction current frequency property, which is the magnitude of the critical high-frequency noise signal at which the LSI 11 causes a malfunction, represented by a terminal current I_LSI flowing to a predetermined portion of the LSI 11, and a malfunction voltage frequency property, which is the magnitude of the critical high-frequency noise signal at which the LSI 11 causes a malfunction, represented by a terminal voltage V_LSI occurring between predetermined points of the LSI 11, both of which properties found from the malfunction power frequency property.

When the evaluation method is carried out, the S-(scattering) parameters of the DUT 10 and the LSI 11 are measured to make the LSI 11 an equivalent circuit and to conduct an AC analysis, and the IBs (immunity behaviors) of the terminal current I_LSI and the terminal voltage V_LSI are simulated (the malfunction current frequency property and the malfunction voltage frequency property are acquired) based on the analysis result. These element steps are sequentially described in detail below.

<S-Parameter Measurement>

Figure 3:
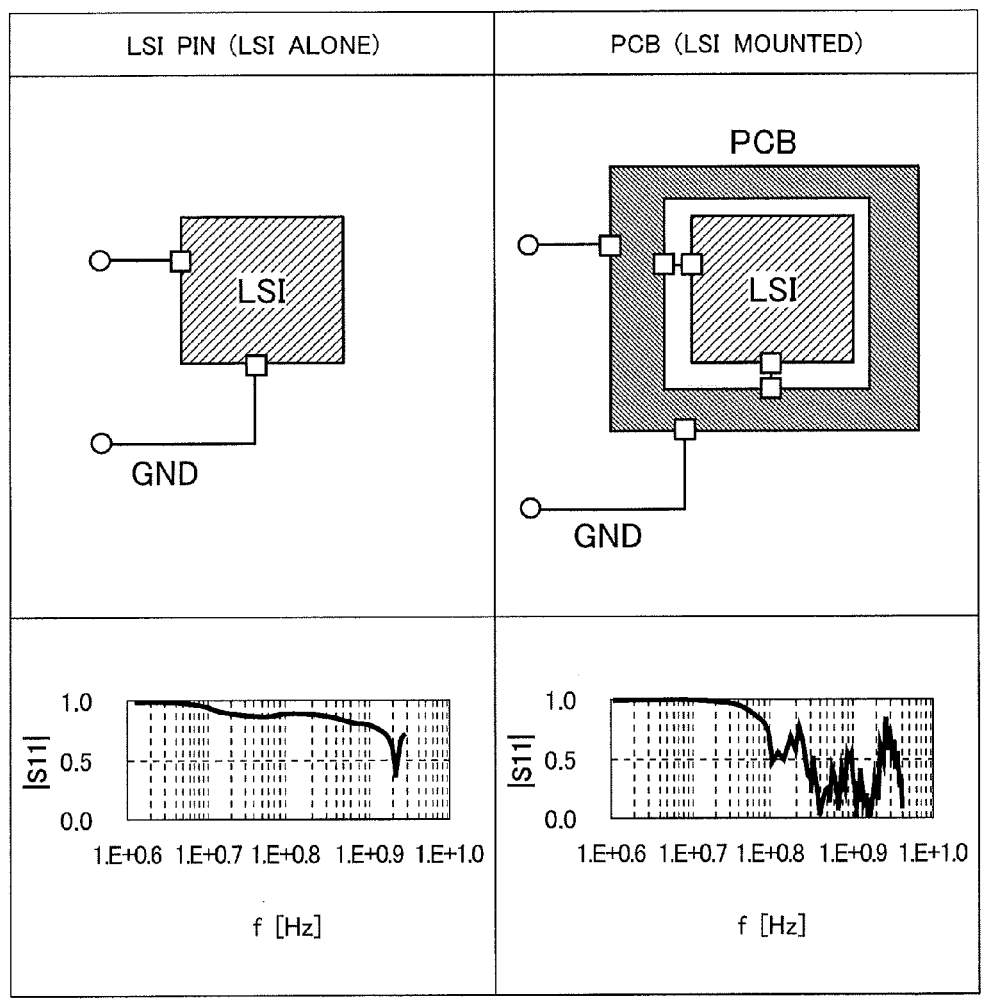
FIG. 3 is a chart showing an example of S-parameter measurement.

FIG. 3 is a chart showing an example of S-parameter measurement. S-parameters are parameters representing frequency properties of the DUT 10 or LSI 11, and S-parameters show power transmission properties or power reflection properties of the circuit network. For example, the S-parameter |S11| shown in FIG. 3 shows the percentage of signals reflected back to a first terminal (reflectance loss) when signals are inputted from the first terminal in a two-terminal circuit (a four-terminal circuit network). In addition to the reflectance loss of the first terminal (|S11|), also measured in the two-terminal circuit are insertion loss from the first terminal to a second terminal (|S21|), insertion loss from the second terminal to the first terminal (|S12|), and reflectance loss of the second terminal (|S22|). The S-parameters of the LSI 11 are preferably measured with the LSI alone, and the S-parameters of the DUT 10 are preferably measured with the LSI mounted on the DUT.

<Making Equivalent Circuit>

Figure 4:
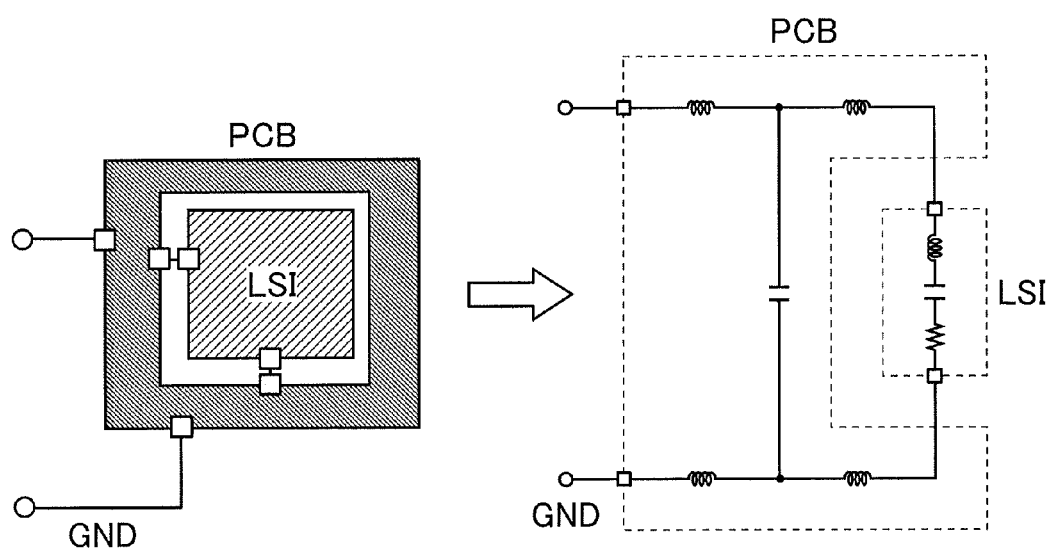
FIG. 4 is a drawing showing an example of making an equivalent circuit.

FIG. 4 is a drawing showing an example of making an equivalent circuit. Making an equivalent circuit from the LSI 11 and the PCB equipped with the LSI is done from the S-parameters of the DUT 10 and the LSI 11. When an equivalent circuit is made, the LSI 11 is preferably regarded as a series circuit having a resistor R, an inductor L, and a capacitor C, and the PCB is preferably represented as the components (capacitor C and the like) installed with the inductor L of the wiring pattern.

<AC Analysis>

Figure 5:
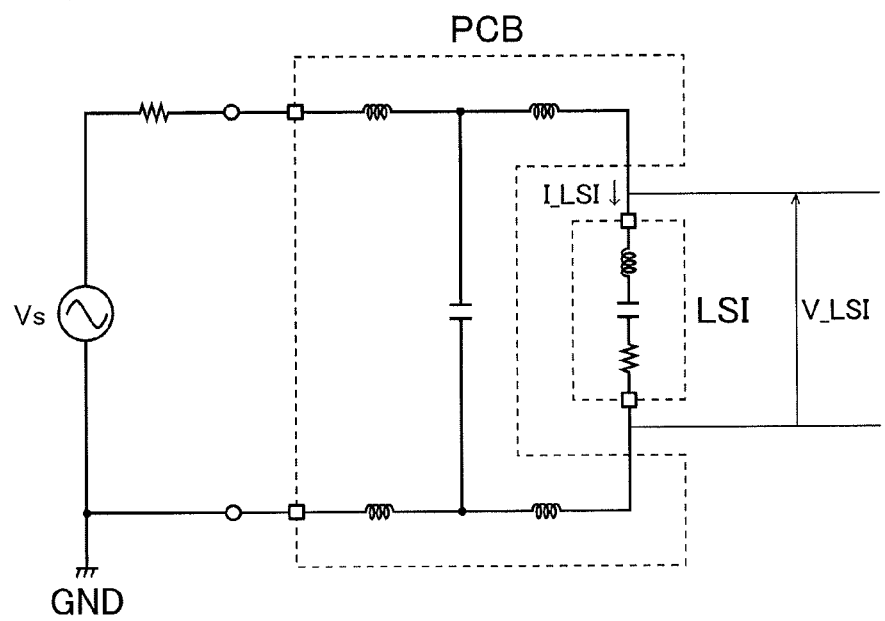
FIG. 5 is a drawing showing an example of the AC analysis.

FIG. 5 is a drawing showing an example of the AC analysis. An AC analysis is performed on the equivalent circuit of the LSI 11 and the PCB equipped with the LSI. A 50Ω AC voltage source is preferably used as the AC signal source for generating AC voltage Vs (Vrms). At this time, the terminal current I_LSI flowing to a predetermined portion of the LSI 11 and the terminal voltage V_LSI occurring between predetermined points of the LSI 11 can both be expressed as functions of the AC voltage Vs, as shown in the following formulas (1a) and (1b).

$$I\_LSI = fI(Vs) \tag{1a}$$

$$V\_LSI = fV(Vs) \tag{1b}$$

The following formula (2) is established between the AC voltage Vs generated by the AC signal source and the injected power Pi sent to the LSI 11.

$$Pi = Vs^2/200 \tag{2}$$

Therefore, when formula (2) is substituted into formulas (1a) and (1b), the terminal current I_LSI and the terminal voltage V_LSI can be expressed as functions of the injected power Pi, as shown respectively in the following formulas (3a) and (3b).

$$I\_LSI = fI(Vs) = fI(\sqrt{(Pi \times 200)}) = gI(Pi) \tag{3a}$$

$$V\_LSI = fV(Vs) = fv(\sqrt{(Pi \times 200)}) = gV(Pi) \tag{3b}$$

Possible examples of the predetermined portion to which the terminal current $I_1$.LSI flows include a signal input terminal of the LSI 11, a signal output terminal, a signal input/output terminal, a power source terminal a GND terminal, a heat-radiating fin plate, and the like. Because malfunctioning in the LSI 11 is particularly likely when a high-frequency noise signal is inputted to a signal input terminal of the LSI 11, it is extremely important to find the malfunction current frequency property or malfunction voltage frequency property of the signal input terminal.

<IB Simulation (Malfunction Current-Voltage Frequency Properties)>

Figure 6:
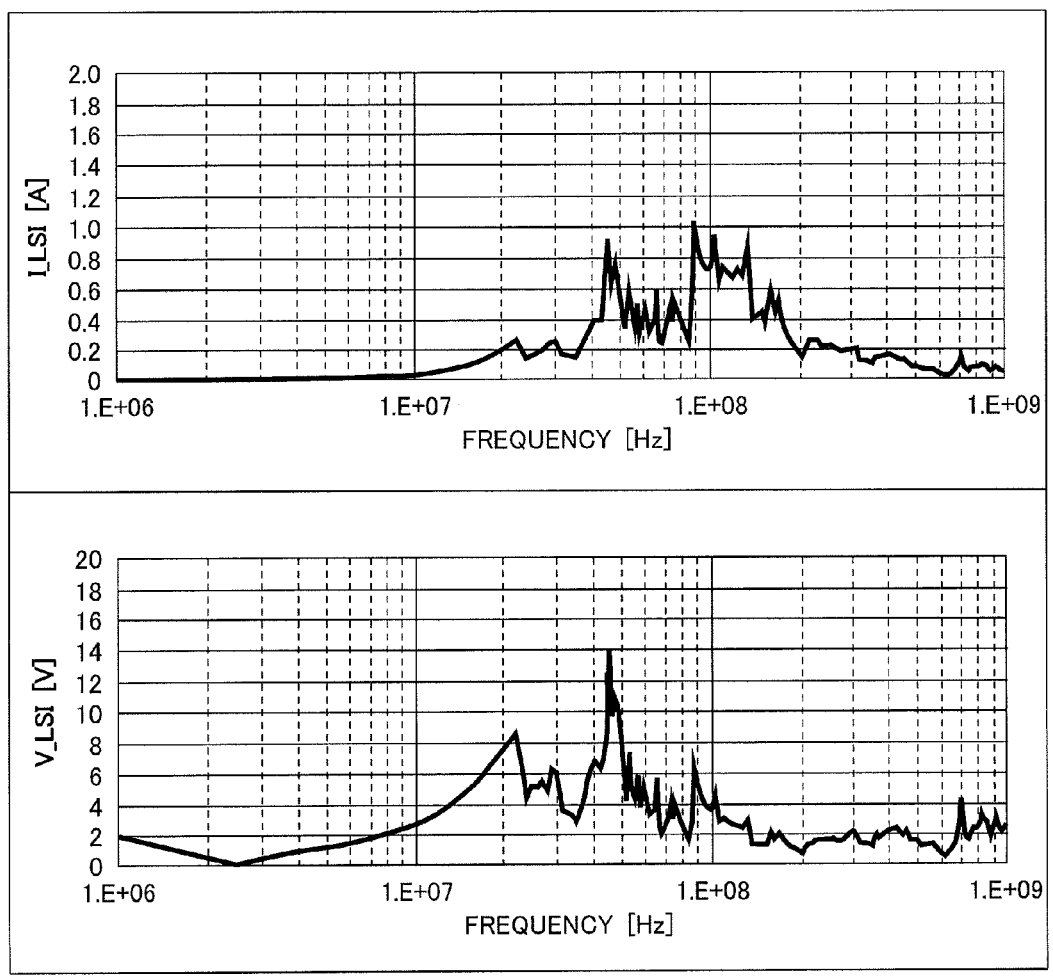
FIG. 6 is a graph showing an example of the malfunction current frequency property/malfunction voltage frequency property.

FIG. 6 is a graph showing an example of the malfunction current frequency property and the malfunction voltage frequency property. When the DPI test results (the critical injected power Pi at which the LSI 11 causes a malfunction) are substituted into the previous formulas (3a) and (b), the critical terminal current I_LSI and terminal voltage V_LSI at which the LSI 11 causes a malfunction are obtained for each oscillation frequency of the high-frequency noise signal.

Thus, in the electric circuit evaluation method according to the present invention, the malfunction power frequency property is a property of the DUT 10, and the malfunction current frequency property and the malfunction voltage frequency property are frequency properties of the LSI 11 extracted from the malfunction power frequency property. In this case, the malfunction current frequency property and malfunction voltage frequency property described above are extracted based on the malfunction power frequency property of the DUT 10, the equivalent circuit of the DUT 10, and the equivalent circuit of the LSI 11.

Data pertaining to the malfunction current frequency property and the malfunction voltage frequency property are preferably provided to the user along with the LSI 11. This providing of data makes it possible for the user to easily avoid LSI 11 malfunctions.

<Comparison of Arriving Current/Voltage Frequency Properties>

Figure 7:
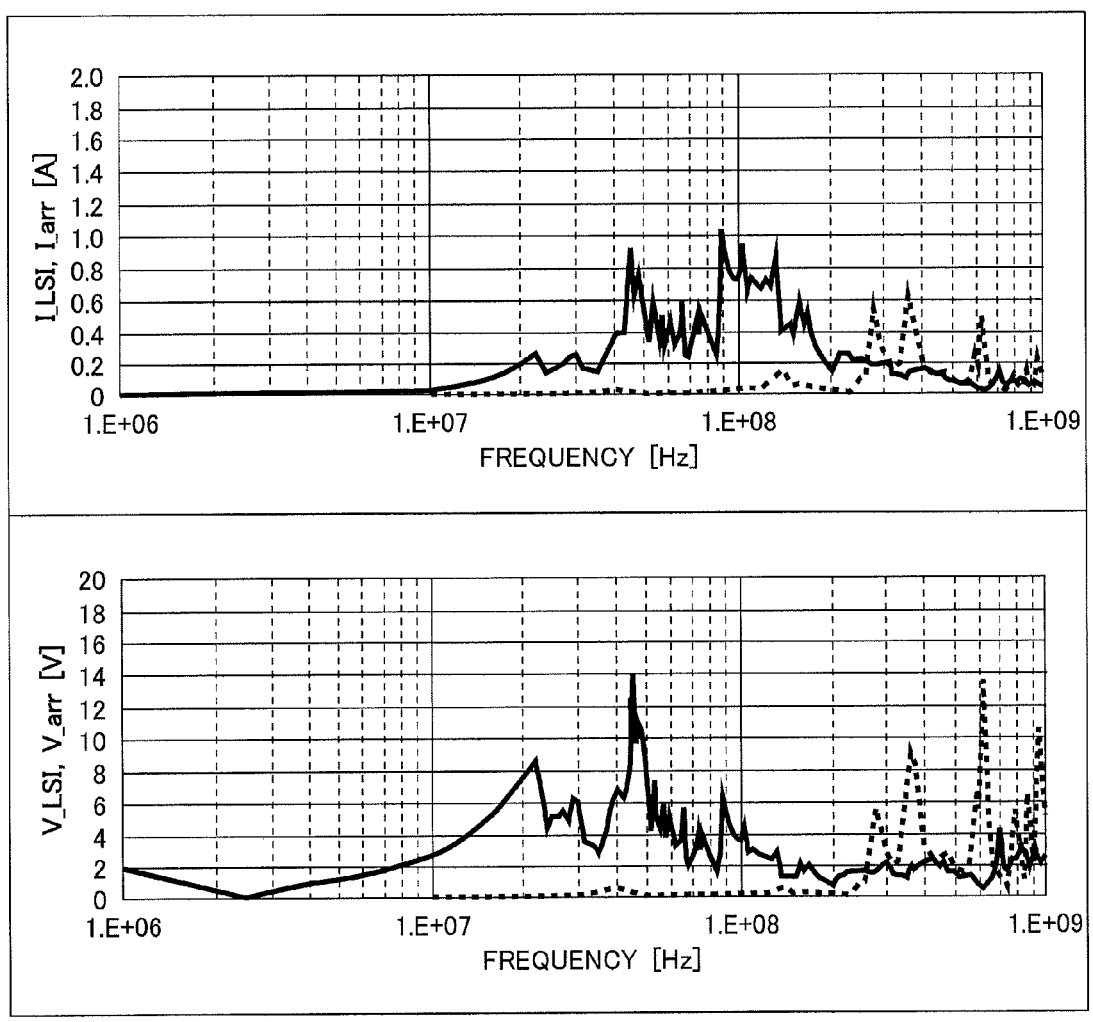
FIG. 7 is a graph showing a comparative example of arriving current/voltage frequency properties.

FIG. 7 is a graph showing an example comparing the malfunction current frequency property and malfunction voltage frequency property shown in FIG. 6 (solid lines), and an arriving current frequency property and arriving voltage frequency property (dashed lines). The arriving current frequency property is a frequency property of an arriving current I_arr that arrives at the predetermined portion of the LSI 11 when a predetermined immunity test (details described hereinafter) is performed on a to-be-measured circuit unit including the LSI 11 or a mock unit thereof. The arriving voltage frequency property is a frequency property of an arriving voltage V_arr that arrives between the predetermined points of the LSI 11 when the aforementioned immunity test is performed.

Thus, to apply the previously found malfunction current frequency property and malfunction voltage frequency property of the LSI 11 to an EMS evaluation, the electric circuit evaluation method according to the present invention has step of comparing these properties with the arriving current frequency property and the arriving voltage frequency property of the LSI 11. Making this comparison makes it possible to assess that the LSI 11 could cause a malfunction at the oscillation frequencies at which the dashed lines in FIG. 7 rise above the solid lines, for example. When the same comparison is made with each terminal of the LSI 11, it is possible to specify terminals that could cause a malfunction, and circuit design can therefore be quickly improved.

Because of this, under the condition of using the same LSI 11, it is possible to estimate whether or not the LSI 11 will cause a malfunction by calculating the terminal current I_LSI and the terminal voltage V_LSI, even when the PCB structure or noise injection method (test method) has changed.

The arriving current frequency property and the arriving voltage frequency property of the LSI 11 are found by a simulation on the basis of on an equivalent circuit of the to-be-measured circuit unit equipped with the LSI 11 or an equivalent circuit of a mock unit. When such a simulation is performed, a predetermined immunity test must be performed on the to-be-measured circuit unit or the mock unit.

When an onboard LSI is the evaluation target, for example, it is preferable to use a test compliant with ISO 11452 as the above-described immunity test. Possible examples of a test compliant with ISO 11452 include a radiated immunity test compliant with ISO 11452-2, a TEMCELL (transverse electromagnetic cell) test compliant with ISO 11452-3, a bulk current injection (BCI) test compliant with ISO 11452-4, and the like. A test compliant with a product immunity examination typified by ISO 7637 or the IEC 61000-4 series may be used as the above-described immunity test. A detailed description is given below, using a BCI test as an example.

<BCI Test>

Figure 8:
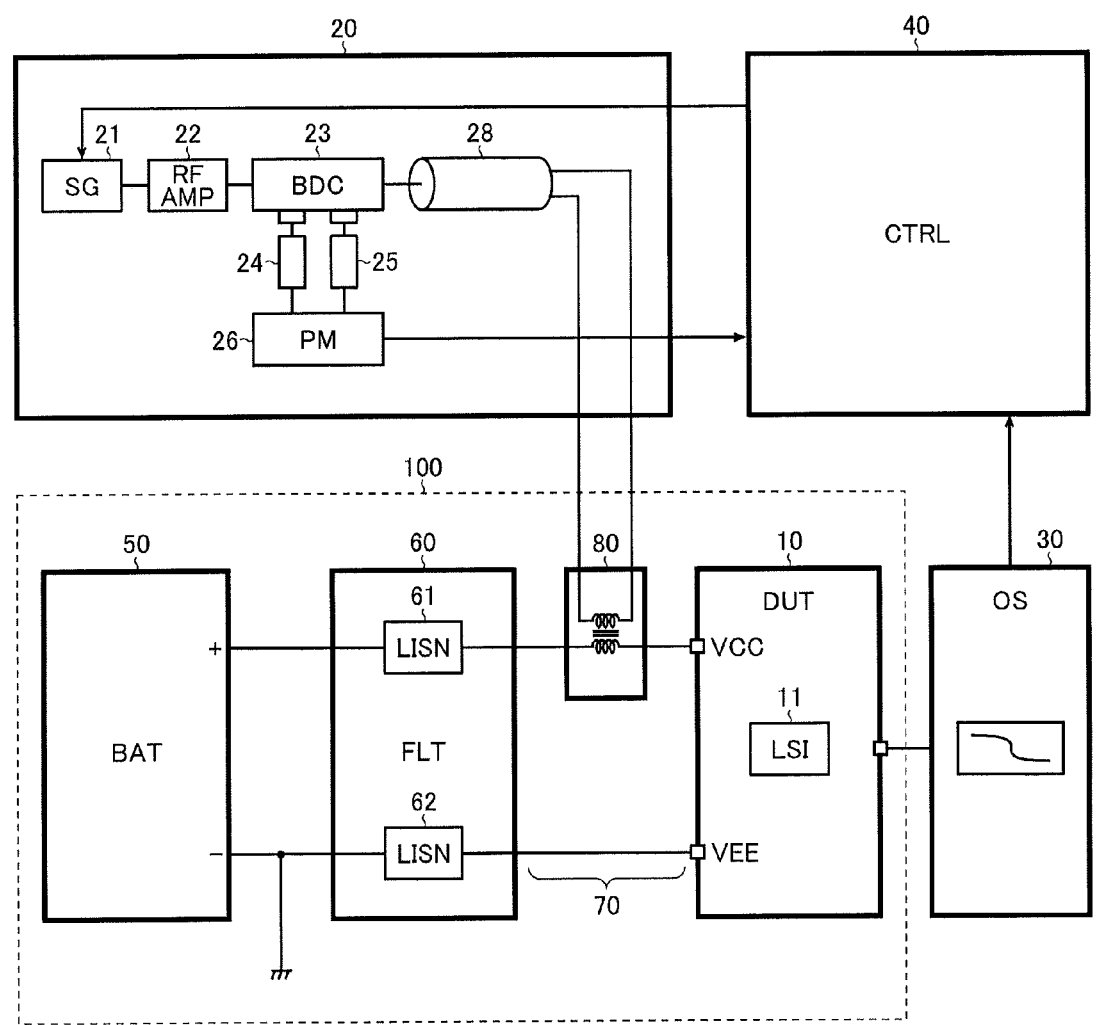
FIG. 8 is a block diagram showing a configuration example of a BCI test.

FIG. 8 is a block diagram showing a configuration example of a BCI test. A BCI test is one component testing method (EMS standards for products: ISO 11452-4), standardized by the international organization for standardization (ISO), for electric obstruction caused by narrowband electromagnetic radiation energy directed at onboard electronic devices.

The BCI test is a test conducted on a to-be-measured circuit unit 100 including the LSI 11 (or a mock unit thereof). Similar to the previous DPI test (see FIG. 1), the BCI test is conducted using a noise source 20, a detection part 30, a controller 40, a battery 50, a power source filter 60, and other components in addition to the DUT 10.

The to-be-measured circuit unit 100, which is equivalent to the actual product (an actual device) on which the LSI 11 is installed, includes a wire harness 70 of about 1.5 to 2.0 m electrically connecting the DUT 10 and the power source filter 60 together, in addition to the previously described DUT 10 and battery 50. An injection probe 80 is inserted into the wire harness 70, and bulk current is injected via a 50Ω transmission line 28 of the noise source 20.

When a BCI test is performed on the to-be-measured circuit unit 100, the arriving current frequency property and the arriving voltage frequency property of the LSI 11 are found by a simulation on the basis of on an equivalent circuit of the to-be-measured circuit unit 100.

When a BCI test is performed on a mock unit having a simplified to-be-measured circuit unit 100, the arriving current frequency property and the arriving voltage frequency property of the LSI 11 are found by a simulation on the basis of on both an equivalent circuit of the to-be-measured circuit unit 100 and an equivalent circuit of the mock unit.

These equivalent circuits are based on the S-parameters of the to-be-measured circuit unit 100 and the S-parameters of the LSI 11.

Thus, the electric circuit evaluation method according to the present invention comprises: a step for finding an arriving current frequency property representing the arriving current I_arr that arrives at the predetermined portion of the LSI 11 when a predetermined immunity test (e.g. a BCI test) is performed on the to-be-measured circuit unit 100 including the LSI 11, the arriving current frequency property being found through a simulation on the basis of on an equivalent circuit of the LSI 11 and an equivalent circuit of the to-be-measured circuit unit 100; and a step for finding an arriving voltage frequency property representing the arriving voltage V_arr that arrives between the predetermined points of the LSI 11 when the immunity test is performed, the arriving voltage frequency property being found through a simulation on the basis of on the equivalent circuit of the LSI 11 and the equivalent circuit of the to-be-measured circuit unit 100.

<Other Modifications>

The various technical characteristics disclosed in the present specification, in addition to how they are portrayed in the above embodiment, can also be modified in various ways within a range that does not deviate from the technical creative scope of the invention. Specifically, the above embodiment is an example in all points and should not be construed as being limiting, the technical range of the present invention is set forth by the claims rather than the description of the above embodiment, and it should be understood that meanings equivalent with the claims and all variations belonging within their scope are included.

INDUSTRIAL APPLICABILITY

The present invention can be utilized when conducting an EMS evaluation of an onboard LSI, for example.

What is claimed is:

1. An electric circuit evaluation method comprising the following steps:
   a step for finding a malfunction power frequency property, in which the magnitude of a critical noise signal at which a designated electric circuit causes a malfunction is represented by the power injected into the designated electric circuit; and
   a step for finding a malfunction current frequency property, in which the magnitude of the critical noise signal at which the designated electric circuit causes a malfunction is represented by a current flowing to a predetermined portion of the designated electric circuit, and a malfunction voltage frequency property, in which the magnitude of the critical noise signal at which the designated electric circuit causes a malfunction is represented by a voltage occurring between predetermined points of the designated electric circuit, both of which properties being found from the malfunction power frequency property.

2. The electric circuit evaluation method of claim 1;
   the malfunction power frequency property being the result of a DPI (direct RF power injection) test.

3. The electric circuit evaluation method of claim 2;
   the DPI test being performed on a device under test that includes the designated electric circuit.

4. The electric circuit evaluation method of claim 3;
   the device under test being a mock device for testing.

5. The electric circuit evaluation method of claim 4;
   the mock device for testing having common configurative elements other than the designated electric circuit.

6. The electric circuit evaluation method of claim 3;
   the malfunction power frequency property being a property of the device under test, and the malfunction current frequency property and the malfunction voltage frequency property being frequency properties of the designated electric circuit extracted from the malfunction power frequency property.

7. The electric circuit evaluation method of claim 6;
   the malfunction current frequency property and the malfunction voltage frequency property being extracted based on the malfunction power frequency property, an equivalent circuit of the device under test, and an equivalent circuit of the designated electric circuit.

8. The electric circuit evaluation method of claim 1, further comprising the following step:
   causing an arriving current frequency property representing a current arriving at the predetermined portion of the designated electric circuit and an arriving voltage frequency property representing a voltage arriving between the predetermined points of the designated electric circuit to be compared to each of the malfunction current frequency property and the malfunction voltage frequency property when a predetermined immunity test is performed on a to-be-measured circuit unit including the designated electric circuit or a mock unit thereof.

9. The electric circuit evaluation method of claim 8; the immunity test being a test compliant with ISO 11452.

10. The electric circuit evaluation method of claim 9; the immunity test being a bulk current injection (BCI) test compliant with ISO 11452-4.

11. The electric circuit evaluation method of claim 8; the immunity test being a test compliant with a product immunity examination.

12. The electric circuit evaluation method of claim 8; the arriving current frequency property and the arriving voltage frequency property being found through a simulation on the basis of an equivalent circuit of the to-be-measured circuit unit or an equivalent circuit of the mock unit.

13. The electric circuit evaluation method of claim 12; the arriving current frequency property and the arriving voltage frequency property being found through a simulation on the basis of both the equivalent circuit of the to-be-measured circuit unit and the equivalent circuit of the mock unit when the immunity test is performed on the mock unit.

14. The electric circuit evaluation method of claim 12; the equivalent circuit being based on S-parameters of the to-be-measured circuit unit and S-parameters of the designated electric circuit.

15. The electric circuit evaluation method of claim 12; the predetermined portion being a signal input terminal of the designated electric circuit.

16. An electric circuit evaluation method comprising the following steps:
   a step for finding a malfunction current frequency property, in which the magnitude of a critical noise signal at which a designated electric circuit causes a malfunction is represented by a current flowing to a predetermined portion of the designated electric circuit;
   a step for finding a malfunction voltage frequency property, in which the magnitude of a critical noise signal at which the designated electric circuit causes a malfunction is represented by a voltage occurring between predetermined points of the designated electric circuit;
   a step for finding an arriving current frequency property, which represents a current reaching the predetermined portion of the designated electric circuit when a predetermined immunity test is performed on a to-be-measured circuit unit including the designated electric circuit;
   a step for finding an arriving voltage frequency property, which represents a voltage reaching between the predetermined points of the designated electric circuit when the immunity test is performed; and
   comparing the arriving current frequency property and the arriving voltage frequency property with each of the malfunction current frequency property and the malfunction voltage frequency property.

17. An electric circuit evaluation method comprising the following steps:
   a step for finding an arriving current frequency property representing a current reaching a predetermined portion of a designated electric circuit when a predetermined immunity test is performed on a to-be-measured circuit unit including the designated electric circuit, the arriving current frequency property being found through a simulation on the basis of on an equivalent circuit of the designated electric circuit and an equivalent circuit of the to-be-measured circuit unit; and
   a step for finding an arriving voltage frequency property representing a voltage arriving between predetermined points of the designated electric circuit when the immunity test is performed, the arriving voltage frequency property being found through a simulation on the basis of on the equivalent circuit of the designated electric circuit and the equivalent circuit of the to-be-measured circuit unit.

* * * * *